United States Patent
Kiridoshi et al.

(10) Patent No.: US 10,700,247 B2
(45) Date of Patent: Jun. 30, 2020

(54) DISPLAY DEVICE AND METHOD FOR MANUFACTURING DISPLAY DEVICE

(71) Applicant: Mitsubishi Electric Corporation, Chiyoda-ku, Tokyo (JP)

(72) Inventors: Satoru Kiridoshi, Tokyo (JP); Sohei Samejima, Tokyo (JP); Tsuyoshi Tanabe, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/312,155

(22) PCT Filed: Jun. 29, 2016

(86) PCT No.: PCT/JP2016/069249
§ 371 (c)(1),
(2) Date: Dec. 20, 2018

(87) PCT Pub. No.: WO2018/003027
PCT Pub. Date: Jan. 4, 2018

(65) Prior Publication Data
US 2019/0165223 A1    May 30, 2019

(51) Int. Cl.
*H01L 33/56* (2010.01)
*H01L 33/62* (2010.01)
(Continued)

(52) U.S. Cl.
CPC .............. *H01L 33/56* (2013.01); *G09F 9/30* (2013.01); *H01L 27/156* (2013.01); *H01L 33/58* (2013.01);
(Continued)

(58) Field of Classification Search
CPC .......... H01L 33/56; H01L 33/58; H01L 33/62; H01L 33/486; H01L 27/156;
(Continued)

(56) References Cited

U.S. PATENT DOCUMENTS

2004/0238834 A1* 12/2004 Yasuoka .............. H05K 1/0274
257/88
2009/0146921 A1   6/2009 Takahashi
2011/0260945 A1  10/2011 Karasawa

FOREIGN PATENT DOCUMENTS

JP   2001056647 A   2/2001
JP   2005018048 A   1/2005
(Continued)

OTHER PUBLICATIONS

International Search Report (with English translation) and Written Opinion issued in corresponding International Patent Application No. PCT/JP2016/069249, 12 pages, dated Sep. 13, 2016.
(Continued)

*Primary Examiner* — Tong-Ho Kim
(74) *Attorney, Agent, or Firm* — Buchanan Ingersoll & Rooney PC

(57) ABSTRACT

A display device includes a substrate, light-emitting elements that emit visible light, and a protective film that is waterproof, has transmissivity to visible light, and has weather resistance. The light-emitting elements are arrayed in a regular manner and separated from each other on one surface of the substrate. The protective film covers each of the light-emitting elements and closely adheres to the one surface of the substrate between the light-emitting elements. Each of the light-emitting elements includes light emitting diodes covered with a resin having a weather resistivity that is lower than a weather resistivity of the protective film.

12 Claims, 5 Drawing Sheets

(51) Int. Cl.
*H01L 33/58* (2010.01)
*H01L 27/15* (2006.01)
*G09F 9/33* (2006.01)
*G09F 9/30* (2006.01)
*H01L 33/48* (2010.01)
*G09F 19/22* (2006.01)
*H01L 25/075* (2006.01)

(52) U.S. Cl.
CPC ............... *H01L 33/62* (2013.01); *G09F 9/33* (2013.01); *G09F 19/22* (2013.01); *H01L 25/0753* (2013.01); *H01L 33/486* (2013.01)

(58) Field of Classification Search
CPC ......... H01L 27/0753; G09F 9/30; G09F 9/33; G09F 19/22
USPC ........................................................ 257/100
See application file for complete search history.

(56) References Cited

FOREIGN PATENT DOCUMENTS

| | | | | |
|---|---|---|---|---|
| JP | 3941487 | B2 | | 7/2007 |
| JP | 2009051876 | A | | 3/2009 |
| JP | 2011040488 | A | * | 2/2011 |
| JP | 2011040488 | A | | 2/2011 |
| JP | 2013038384 | A | * | 2/2013 ............... H05K 3/28 |
| JP | 2013038384 | A | | 2/2013 |
| JP | 5194759 | B2 | | 5/2013 |
| JP | 2015132788 | A | * | 7/2015 |
| JP | 2015132788 | A | | 7/2015 |
| JP | 2016012070 | A | * | 1/2016 |
| JP | 2016012070 | A | | 1/2016 |
| JP | 2016109932 | A | * | 6/2016 |
| JP | 2016109932 | A | | 6/2016 |

OTHER PUBLICATIONS

Office Action (Notice of Reasons for Refusal) dated Jun. 11, 2019, by the Japan Patent Office in corresponding Japanese Patent Application No. 2018-524631 and English translation of the Office Action. (12 pages).

Office Action dated Apr. 23, 2020, by the Chinese Patent Office in corresponding Chinese Patent Application No. 2016-80087067.0 and English translation of the Office Action. (17 pages).

* cited by examiner

DISPLAY DEVICE AND METHOD FOR MANUFACTURING DISPLAY DEVICE

TECHNICAL FIELD

The present disclosure relates to a display device and a method for manufacturing the display device.

BACKGROUND ART

A conventional display device is equipped with display units having light-emitting elements arrayed in a matrix pattern. This type of display device, for example, is installed indoors in a gymnastic hall, theater, exhibit site, and the like, or is installed outdoors in a sports stadium or on a wall of a building.

When the display device is installed outdoors, outside light is reflected by light emitter surfaces of light-emitting elements, luminance of extinguished light-emitting elements increases, and such increase may lower contrast of a display image. Further, the display device is exposed to rain, snow, and the like so that water may penetrate to the terminals of the light-emitting elements, and the light-emitting elements may deteriorate.

Various methods are proposed to prevent such lowering of contrast and deterioration of the light-emitting elements. For example, Patent Literature 1 discloses a light-emitting unit that has a substrate on which a water-proofing resin layer is formed and light-emitting elements mounted on the substrate. The water-proofing resin layer is formed from silicone resin or urethane resin, covers the terminals of the light-emitting elements, and waterproofs and protects the terminals. In order to increase contrast of the display image, the light-emitting unit disclosed in Patent Literature 1 is equipped with an eave-shaped louver that limits the entry of outside light and is disposed above the resin layer.

CITATION LIST

Patent Literature

Patent Literature 1: Unexamined Japanese Patent Application Kokai Publication No. 2001-56647

SUMMARY OF INVENTION

Technical Problem

The louver of the display device disclosed in Patent Literature 1 is arranged on the resin layer. Thus the position of disposal of the louver is higher in comparison to a display device that is not equipped with the resin layer. Thus when a louver for use on the display device that is not equipped with the resin layer is attached as is to the resin layer, the louver thus sometimes blocks the light of the light-emitting element. Further, the display device is expensive to manufacture due to the forming of the resin layer on the substrate.

In order to solve the aforementioned problems, an object of the present disclosure is to provide a display device that prevents blockage of light of the light-emitting element by the louver, is waterproof, and has a low manufacturing cost.

Solution to Problem

In order to attain the aforementioned objective, the display device according to the present disclosure includes a substrate, light-emitting elements that emit visible light, and a film member that is waterproof, has transmissivity to visible light, and has weather resistance. The light-emitting elements are arrayed in a regular manner and separated from each other on one surface of the substrate. The film member covers each of the light-emitting elements and closely adheres to the one surface of the substrate between the light-emitting elements. The light-emitting element has light emitting diodes covered with a resin having a weather resistivity that is lower than a weather resistivity of the film member.

Advantageous Effects of Invention

According to the present disclosure, the film that is waterproof covers each of the light-emitting elements and closely attaches to the one surface of the substrate between the light-emitting elements, and thus penetration of water from the exterior to the light-emitting elements is prevented. Thus waterproofness of the display device increases in accordance with the present disclosure.

The film member closely adheres to the only one surface of the substrate between the light-emitting elements, and thus even when the louver is arranged between the light-emitting elements, the distance from the one surface of the substrate to the louver tends not to become large. Such configuration enables prevention of the blockage of light of the light-emitting element by the louver.

Due to lack of a requirement for covering the light emitting diodes by a resin having a high weather resistivity, an inexpensive resin having a low weather resistivity can be used in the manufacture of the light emitting diodes. Thus the display device is inexpensive to manufacture.

DESCRIPTION OF EMBODIMENTS

Figure 1:
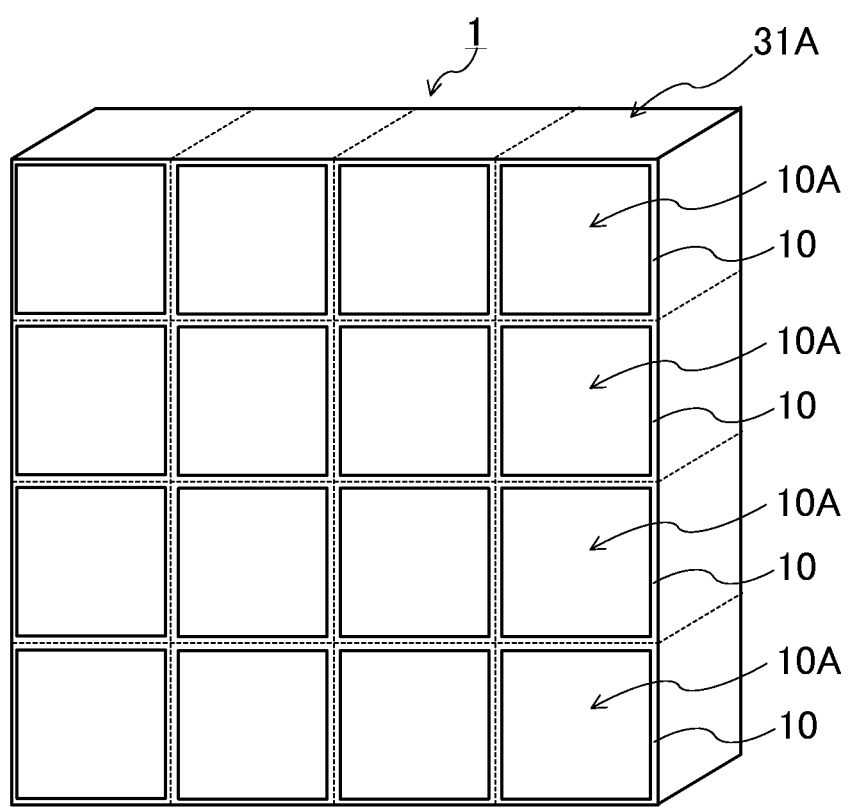
FIG. 1 is a perspective view of a display device according to Embodiment 1 of the present disclosure.

A display device of embodiments of the present disclosure is described below in detail with reference to drawings. In the drawings, components that are the same or equivalent are assigned the same reference signs.

Embodiment 1

A display device according to Embodiment 1 is a so-called large-sized image display that is installed outdoors at a facility such as a stadium or horse track. Configuration of the display device is described below with reference to FIGS. 1 to 5.

As illustrated in FIG. 1, a display device 1 according to Embodiment 1 is configured as a combination of 16 display units 10 in a matrix pattern of 4 rows by 4 columns.

Each of the display units 10 has a screen 10A that is formed in a square shape and displays an image. Multiple display units 10 are combined in a state in which screen 10A edges abut each other. A signal forming a portion of the image is input to each of the display units 10. Thus the display device 1 displays a single image on an entirety of the 16 screens 10A.

Figure 2:
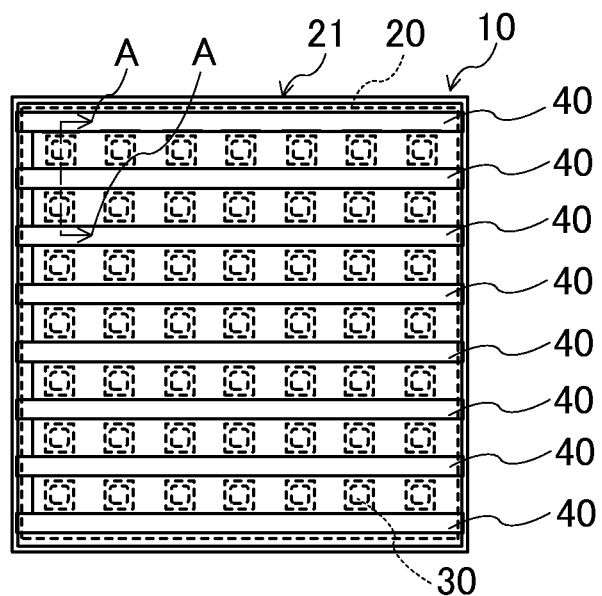
FIG. 2 is a front view of a display unit included in the display device.
Figure 3:
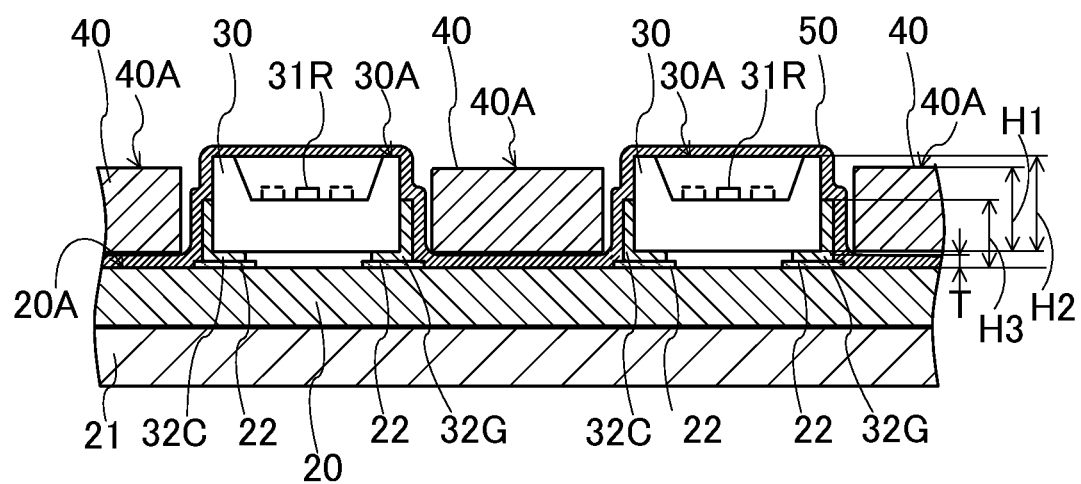
FIG. 3 is a cross-sectional view taken along line A-A in FIG. 2.

As illustrated in FIGS. 2 and 3, each of the display units 10 includes a substrate 20, light-emitting elements 30 arrayed in matrix pattern on the substrate 20, louvers 40 preventing reflection of outside light, and a protective film 50 protecting the substrate 20 and the light-emitting elements 30 from rain and snow.

The substrate 20 is formed in a square shape as illustrated in FIG. 2. On a back surface of the substrate 20, non-illustrated wiring is arranged for transmission of a signal for driving the light-emitting elements 30. This wiring is connected to a non-illustrated drive circuit of the light-emitting elements 30. The substrate 20 is housed in a case 21 in a state in which the back surface faces a bottom of the case 21.

At the front surface of the substrate 20, the light-emitting elements 30 are mounted in a matrix pattern of 7 rows by 7 columns and in a state of mutual separation from each other. Further, as illustrated in FIG. 3, electrode pads 22 are arranged at a position of disposal of the light-emitting element on the front surface of the substrate 20. The electrode pads 22 are disposed at positions facing below-described package electrodes 32R, 32G, 32B, and 32C of the light-emitting element 30. The electrode pads 22 are each connected to non-illustrated wiring of the back surface. The electrode pad 22 interconnects the light-emitting element 30 and the drive circuit together via the wiring of the back surface.

Figure 4:
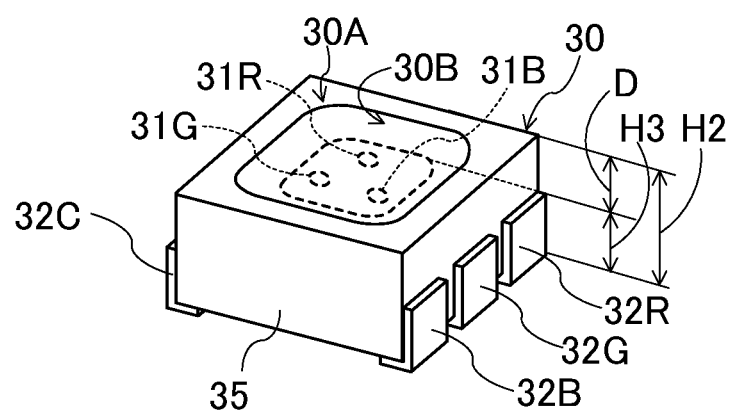
FIG. 4 is a perspective view of a light-emitting element included in a light-emitting unit.

As illustrated in FIG. 4, the light-emitting element 30 has a concavity 30B in an upper surface 30A of a package 35. Surface mounting device (SMD) type light emitting diodes 31R, 31G, and 31B (light emitters) are mounted in the concavity 30B. That is, the light-emitting element 30 is a so-called 3-in-1 type.

In order to prevent loss of light from the light emitting diodes 31R to 31B so as to increase light-emission efficiency of the light emitting diodes 31R to 31B, the concavity 30B of the light-emitting element is formed more shallowly than the concavity of the light-emitting element used in a conventional display device for outdoor installation. A depth D of the concavity 30B is no more than 80% of a height H2 of the package 35 (height from the back surface to the upper surface 30A of the package 35). More specifically, when the height H2 of the package 35 is 1.5 to 2.0 mm, the depth D is 0.5 to 1.5 mm.

Further, in the concavity 30B, non-illustrated pads connected to the terminals of the light emitting diodes 31R to 31B are arranged as 2 pads each, 6 in total, for the light emitting diodes 31R to 31B. Further, the concavity 30B is sealed by an epoxy resin that covers the light emitting diodes 31R to 31B.

Package electrodes 32R, 32G, 32B, and 32C connected to the pads are arranged at the outer side surfaces of the package 35. The package electrodes 32R, 32G, and 32B are signal electrodes connected to 3 pads connected to anodes, or cathodes, of the light emitting diodes 31R to 31B. The package electrode 32C is a common electrode connecting in common to 3 separate pads connected to the cathodes, or the anodes, of the light emitting diodes 31R to 31B.

The package electrodes 32R to 32C each extend from the respective pad arranged on the concavity 30B, pass through the interior of the package 35, are exposed to the exterior at the side surface of the package 35, and further extend from the side surface toward the back surface of the package 35. In the aforementioned manner, the concavity 30B is formed more shallowly than the concavity of the light-emitting element used in the conventional display device for outdoor installation. Thus for the package electrode 32R to 32C the length from the side surface to the back surface of the package 35, that is, the height H3, is greater than the height of the light-emitting element of the conventional display device for outdoor installation. As described in detail, the height H3 of the package electrodes 32R to 32C is at least 20%, and no more than 100%, of the height H2 of the package 35. For example, if the height H2 of the package 35 is 1.5 to 2.0 mm, the height H3 is 1.0 mm. The package electrodes 32R to 32C are connected by soldering to the electrode pads 22 disposed on the front surface of the substrate 20 in the aforementioned manner.

The non-illustrated drive circuit sends current through the wiring as drive currents of magnitudes corresponding to the light emission intensities of the light emitting diodes 31R to 31B between the package electrode 32R and the package electrode 32C, between the package electrode 32G and the package electrode 32C, and between the package electrode 32B and the package electrode 32C. Thus the light-emitting element 30 emits light of a desired color and at a desired intensity.

Louvers 40 extending parallel to the rows of the light-emitting elements 30 are disposed on the front surface of the substrate 20 illustrated in FIG. 2. The louvers 40 vertically sandwich the rows of the light-emitting elements 30. Also, the louvers 40 are attached to the case 21.

Each of the louvers 40 is formed to have a rectangular cross-sectional shape as illustrated in FIG. 3. In order to prevent reflection of outside light, the louver 40, on an upper surface 40A thereof, undergoes surface processing such as surface texturing, matte coating, or the like. The louver 40 is formed from a black colored resin.

In order for the louver 40 itself not to impede the light emitted by the light-emitting element 30 and weaken the light intensity of the light-emitting element 30, the louver 40 is formed such that the upper surface 40A is lower than the upper surface 30A of the light-emitting element 30. A height H1 of the louver 40 is smaller than a sum of the light-emitting element 30 height H2 and a thickness T of the protective film 50. The louver 40 is disposed on the protective film 50.

The protective film 50 is a component for transmitting visible light emitted by the light-emitting element 30, and also for preventing entry of water and deterioration and shorting of the package electrodes 32R to 32C and the electrode pads 22. The protective film 50 covers the light-emitting elements 30 and the upper surface of the substrate 20.

Figure 5:
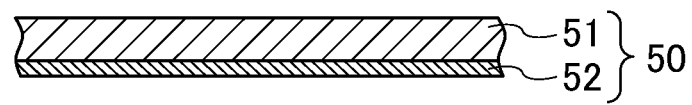
FIG. 5 is a cross-sectional view of a protective film included in the display unit of the display device.

As illustrated in FIG. 5, the protective film 50 includes base layer 51 having flexibility and an adhesive layer 52 provided for gluing the base layer 51 to the substrate 20.

The base layer 51 is formed from a material that is highly waterproof and has high transmissivity for the visible light emitted by the light-emitting elements 30, and that has high ultraviolet absorptivity in order to protect the light-emitting element 30 from ultraviolet radiation. The material of the base layer 51 further has a high weather resistance. Here the term "weather resistivity" means a property of resistance to the occurrence of changes such as deformation, discoloration, and the like when the material is used outdoors. The material that is waterproof, has transmissivity, has ultraviolet absorptivity, and also has the high weather resistivity in the aforementioned manner is formed, for example, from polycarbonate resin, acrylic resin, fluorocarbon resin, and the like; and the base layer 51 is formed from, among these materials, polycarbonate resin.

In order to allow the transmission of light of the light-emitting elements 30, the adhesive layer 52 is configured as a transparent layer that allows the transmission of visible light. The adhesive layer 52 is arranged on one surface of the base layer 51.

The thickness T of the protective film 50, as illustrated in FIG. 3, is less than the height H3 from the upper surface of the substrate 20 to the upper edge of the package electrodes 32R to 32C, that is, the portion most distant from the substrate 20. A specific thickness T of the protective film 50, for example, is 0.1 to 0.5 mm. In the present embodiment, when the protective film 50 is formed of such thickness, even when a conventional louver is attached (louver that is attached to the display unit having formed on the substrate the water resistant resin layer of the height covering the package electrodes), the upper surface 40A of the louver 40 is lower than the upper surface 30A of the light-emitting element 30, and thus the louver 40 does not impede the light emitted by the light-emitting elements 30.

Further, if the height H2 of the package 35 is 1.5 to 2.0 mm, the height H3 of the package electrodes 32R to 32C is 1.0 mm.

As illustrated in FIG. 3, in the state in which the adhesive layer 52 faces the front surface 20A of the substrate 20, the protective film 50 covers the substrate 20. Specifically, at each of the light-emitting elements 30, the protective film 50 covers and closely adheres to the upper surface 30A and the side surfaces of the package 35, and the package electrodes 32R to 32C on the side surfaces. Further, between the light emitting elements 30, the protective film 50 covers the front surface 20A of the substrate 20 and closely adheres to the substrate 20. Thus the protective film 50 protects the light-emitting elements 30 and the substrate 20 from rain, ultraviolet radiation, and the like of the environment.

A method of manufacture of the display device 1 according to Embodiment 1 is described next. Firstly, a substrate 20 is prepared on which the aforementioned electrode pads 22 are arrayed. The package electrodes 32R to 32C of the light-emitting elements 30 are connected to the electrode pads 22 of the prepared substrate 20 to mount the light-emitting elements 30 on the substrate 20.

After mounting of the light-emitting elements 30, the protective film 50 is overlaid onto the substrate 20 in a state such that the surface of the substrate 20 on which the light-emitting elements 30 are mounted is oriented upward. The overlaid protective film 50 is pressed from above to cause the adhesive layer 52 of the protective film 50 to closely adhere to the light-emitting elements 30 and the substrate 20. In the step in which the protective film 50 is closely adhered to the substrate 20 and the light-emitting elements 30, a vacuum device, for example, may be used to expel air from between the protective film 50 and the substrate 20.

However, the louvers 40 of the aforementioned shape may be manufactured by resin molding such as injection molding or cast molding. The manufactured louver 40 may undergo surface texturing. The texturing of the louver 40 may be formed by resin molding.

Thereafter, the louver 40 is disposed on the protective film 50 between the rows of the light-emitting elements 30.

The substrate 20 with the louver 40 placed thereon is housed in the case 21, and the substrate 20 and the louver 40 are fixed to the case 21. The display unit 10 is thus completed.

Thereafter, the display units 10 are combined together to assemble the display device 1.

Although the louver 40 is formed by resin molding in the above description, the louver 40 may be formed by method other than resin molding. The louver 40 may be formed by a cutting process. Further, the louver 40 may be formed from a metal.

The protective film 50 in the above description is equipped with the adhesive layer 52. A bonding layer may be used in place of the adhesive layer 52. Rather than using the adhesive layer 52 or the bonding layer, a surface of the base layer 51 may undergo activation treatment in order to impart tackiness or adhesivity to the surface of the base layer 51. Examples of the activation treatment include UV treatment by irradiating the surface of the base layer 51 with ultraviolet radiation, and plasma treatment by exposing the surface of the base layer 51 to a plasma environment.

In the display device 1 according to Embodiment 1 as described above, the water resistant protective film 50 covers the substrate 20 and the light-emitting elements 30. The protective film 50 further closely adheres to the packages 35 of the light-emitting elements 30 as well as the front surface 20A of the substrate 20 between the light-emitting elements 30. Thus even when the display device 1 is installed outdoors and therefore is exposed to rain and snow, penetration of water to the light-emitting elements 30 of the display device 1 is difficult.

In the display device 1, the protective film 50 covers the front surface 20A of the substrate 20, and thus water hardly contacts the electrode pads 22 and the package electrodes 32R to 32C. Thus deterioration of the electrode pads 22 and the package electrodes 32R to 32C due to water is prevented.

Conventionally, in order to prevent deterioration of the light emitting diodes due to heat or ultraviolet radiation, conventionally means are used such as intermixing an ultraviolet absorption agent in a sealant used for sealing the light emitting diodes, and using a sealant that includes a silicone that has the high weather resistivity. Further, such a sealant may be coated on the light emitting diodes.

In contrast, in Embodiment 1, the protective film 50 is formed from a material that has an ultraviolet radiation absorptivity and a weather resistivity that are high. Further, the protective film 50 may be coated batch-wise onto a large number of the light-emitting elements 30. Thus according to Embodiment 1, the display device 1 that prevents deterioration of the light-emitting elements 30 by ultraviolet light can be manufactured at low cost.

Further, the protective film 50 is formed from a material for which the ultraviolet radiation absorptivity and the weather resistivity are high, and thus neither the intermixing of the ultraviolet radiation absorption agent in the sealant of the light-emitting element 30 nor the use of the sealant that includes the highly weather-resistant silicone are required. Due to lack of the requirement for a sealant for which the ultraviolet radiation absorptivity and the weather resistivity are high, an inexpensive sealant can be used, and the display device 1 can be manufactured at low cost. Further, epoxy resin is used as the sealant in Embodiment 1. In comparison to the conventional sealant, adhesivity of the sealant can be increased and manufacturing cost can be lowered.

In order to waterproof the substrate and the light-emitting element in the conventional display device, the electrode pads and the package electrodes are covered by a silicone filler layer. Thus the filler layer is thick. This thickness raises the cost of manufacture and increases the weight and thickness of the display device. Further, due to thickness of the filler, the upper surface 40A of the louver 40 is higher than the upper surface 30A of the light-emitting element 30, and this results in the louver 40 impeding the light emitted from the light-emitting element 30 so that light intensity declines. This lowering of light intensity causes revision of the design of the louver 40 and/or the light-emitting element 30, which invites an increase in cost.

In contrast, the protective film 50 in Embodiment 1 covers the upper surface 30A and the side surfaces of the light-emitting elements 30, as well as covers the front surface 20A of the substrate 20 between the light-emitting elements 30. Thus Embodiment 1 enables the providing of the display device 1 that has lowered manufacturing cost and that is miniaturized with a low weight and thickness. Further, the thickness T of the protective film 50 is smaller than the height H3 of the package electrodes 32R to 32C, and thus the upper surface 40A of the louver 40 tends not to be higher than the upper surface 30A of the light-emitting element 30. Such configuration makes the louver 40 tend not to impede the light emitted by the light-emitting elements 30, and prevents the lowering of light intensity of the light-emitting elements 30.

In Embodiment 1, the protective film 50 covers the entirety of the side surfaces of the package 35. Further, height H3 of the package electrodes 32R to 32C is at least 20% and no more than 100% of the height H2 of the side surfaces of the package 35. Since the height H3 of the package electrodes 32R to 32C is no more than 100% of the height H2 of the side surfaces of the package 35, the package electrodes 32R to 32C are completely covered by the protective film 50 and thus are waterproofed by the protective film 50. Further, since the height H3 of the package electrodes 32R to 32C is at least 20% of the height H2 of the package 35, the depth D of the concavity 30B of the light-emitting element 30 is no more shallow than 80% of height H2 of the package 35, and thus loss of light of the light emitting diodes 31R to 31B mounted in the concavity 30B is lowered, thereby enabling an increase in light-emission efficiency.

Embodiment 2

In the display device 1 according to Embodiment 2, a coating member 55 is arranged on the front surface 20A of the substrate 20 and on the back surface of the louver 40. Configuration of the display device 1 according to Embodiment 2 is described below with reference to FIG. 6. In Embodiment 2, the configuration of differences with respect to Embodiment 1 is described.

The coating member 55 is a film member that is formed by applying a paint, that is, a coating material, that includes materials that have the high weather resistivity. The coating member 55 has high water resistance, for protection of the package electrodes 32R to 32C and the electrode pads 22 from water, combined with high transparency for allowing transmission of visible light of the light-emitting elements 30. Silicone resins and fluorocarbon resins are materials that have such characteristics.

Figure 6:
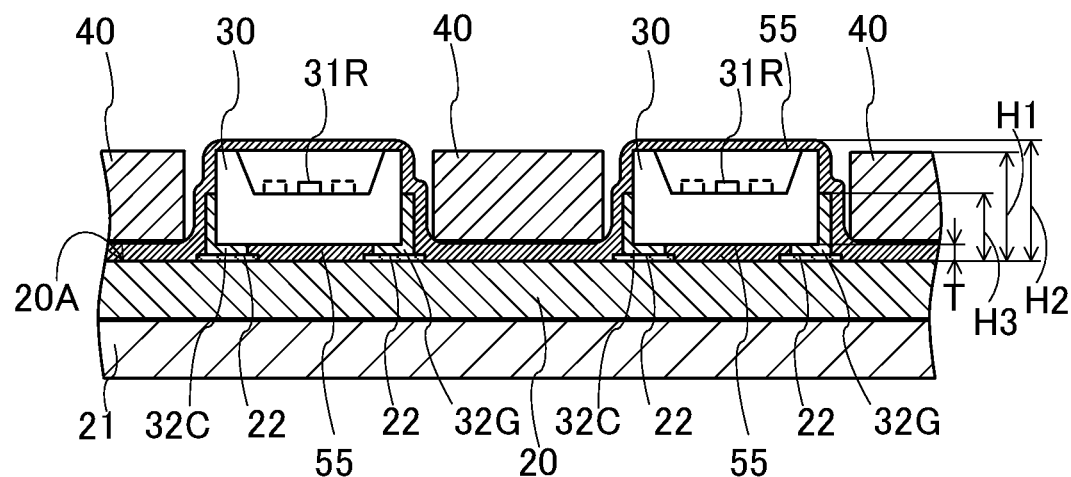
FIG. 6 is a magnified cross-sectional view of a portion of a display unit of a display device according to Embodiment 2 of the present disclosure.

In order to protect the light-emitting elements 30 and the substrate 20 from moisture and ultraviolet radiation, as illustrated in FIG. 6, the coating member 55 is formed so as to cover the upper surface 30A, the side surface, and the package electrodes 32R to 32C of the package 35 of the light-emitting elements 30, and also cover the front surface 20A of the substrate 20 between the light-emitting elements 30. In the below described manner, due to application of the coating material to the front surface 20A of the substrate 20, the coating material penetrates even between the light-emitting element 30 and the front surface 20A of the substrate 20.

The coating member 55 is film-like in order to allow transmission of visible light emitted by the light-emitting elements 30. The thickness T of the coating member 55 is sufficiently smaller than the height H3 of the package electrodes 32R to 32C. Specifically, thickness T of the coating member 55 is, for example, 0.01 to 0.5 mm.

Next, the manufacturing method of the display device 1 according to Embodiment 2 is described. In the manufacturing method of the display device 1 according to Embodiment 2, after mounting the light-emitting elements 30, the coating material is applied onto the substrate 20 to form the coating member 55. Other steps are the same as the steps of the manufacturing method of the display device 1 according to Embodiment 1. The step of forming the coating member 55 is described below.

In the step of forming the coating member 55, firstly the substrate 20 is oriented such that the surface on which the light-emitting elements 30 are mounted is directed upward. Then the coating material is applied to the substrate 20 and the light-emitting elements 30. A coating agent having silicone resin as a main ingredient is used as the coating material. The coating method is a method that attaches the coating agent along the surface of the application target, and such methods are, for example, potting by dispenser, spray coating, printing, and the like. The application amount is an amount that results in the coating member 55 having the aforementioned thickness.

Next, the applied coating material is allowed to dry and cure. By this means, the coating member 55 is formed that closely adheres to the light-emitting elements 30 and the surface of the substrate 20. After formation of the coating member 55, the louver 40 is placed on the coating member 55. The steps thereafter are the same as the steps of Embodiment 1.

In the aforementioned manner, in the display device 1 according to Embodiment 2, the light-emitting elements 30 and the front surface 20A of the substrate 20 are covered by the coating member 55 that has the high weather resistivity. Thus for the display device 1 according to Embodiment 2, rain and snow hardly penetrate to the light-emitting elements 30 within the display device 1.

In the display device 1 according to Embodiment 2, the coating member 55 is formed by application of the coating material. Thus between the coating member 55 and the substrate 20 and the light-emitting element 30, there is hardly any occurrence of gaps and condensation. This enables prevention of the attachment of moisture to the electrode pads 22 and the package electrodes 32R to 32C.

Embodiment 3

Figure 7:
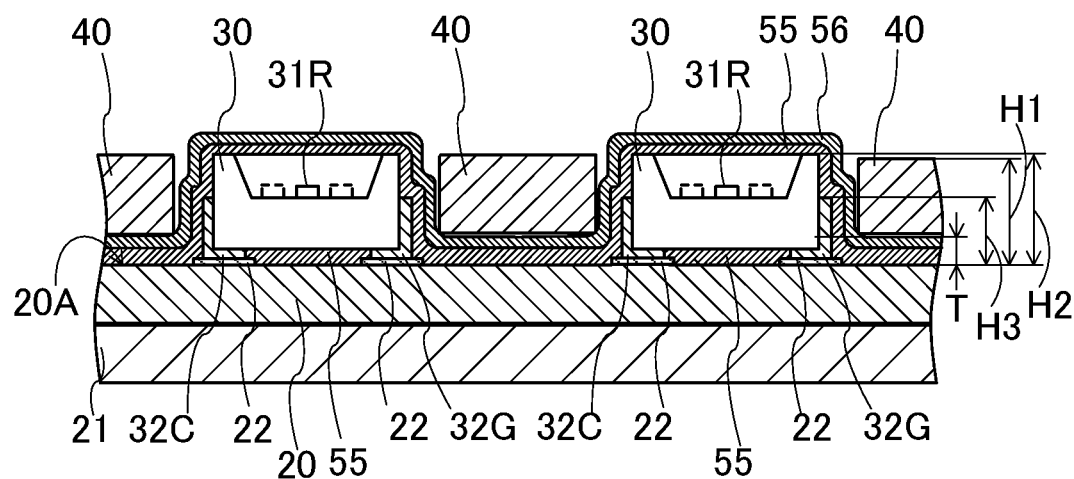
FIG. 7 is a magnified cross-sectional view of a portion of a display unit of a display device according to Embodiment 3 of the present disclosure.

In the display device 1 according to Embodiment 3, an ultraviolet radiation absorption film 56 is stacked on the coating member 55 described in Embodiment 2. Configuration of the display device 1 according to Embodiment 3 is described below with reference to FIG. 7. In Embodiment 3, the configuration of differences with respect to Embodiments 1 and 2 is described.

The ultraviolet radiation absorption film 56 is arranged above the coating member 55 and below the louver 40. The ultraviolet radiation absorption film 56 is disposed along the upper surface of the coating member 55 and closely adheres to the upper surface of the coating member 55.

The ultraviolet radiation absorption film 56 is formed from a material having high ultraviolet radiation absorptivity in order to prevent ultraviolet radiation-induced deterioration of the light-emitting element 30. However, the ultraviolet radiation absorption film 56 is required to allow transmission of visible light emitted by the light-emitting elements 30. Thus the ultraviolet radiation absorption film 56 preferably has high visible light transmissivity. Examples of such materials are acrylic resins, epoxy resins, silicone resins, fluorocarbon resins, polycarbonate resins, olefin-type resins, polyester resins, and the like; and among such materials, acrylic resin is used in the ultraviolet radiation absorption film 56.

The ultraviolet radiation absorption film 56 is formed such that the combined thickness T of the coating member 55 and the ultraviolet radiation absorption film 56 is smaller than the height H3 of the package electrodes 32R to 32C. Specifically, the combined thickness T of the coating member 55 and the ultraviolet radiation absorption film 56 is, for example, 0.01 to 0.5 mm. Due to formation at such thickness in the present embodiment, even when a conventional louver is attached, the upper surface 40A of the louver 40 is lower than the upper surface 30A of the light-emitting elements 30, and thus the louver 40 does not impede the light emitted by the light-emitting elements 30.

Next, the manufacturing method of the display device 1 according to Embodiment 3 is described. The manufacturing method of the display device 1 according to Embodiment 3 is the same as the manufacturing method of the display device 1 according to Embodiment 2 up to the step of application of the coating material of the coating member 55. In Embodiment 3, after application of the coating material of the coating member 55, and prior to allowing the coating material to dry, the applied coating material is overlaid onto the ultraviolet radiation absorption film 56. At this time, the ultraviolet radiation absorption film 56 is made to closely adhere to the substrate 20 and the light-emitting elements 30 coated by the coating material, and thus gaps are prevented from forming between the coating material and the ultraviolet radiation absorption film 56.

Thereafter, the coating material is allowed to dry and cure. In this manner, the ultraviolet radiation absorption film 56 is fixed to the coating member 55 simultaneous with the forming of the coating member 55. Thereafter, the louver 40 is overlaid onto the ultraviolet radiation absorption film 56, and the louver 40 is attached to the substrate 20. The steps after attachment of the louver 40 are the same as such steps in Embodiment 1.

As described above, for the display device 1 according to Embodiment 3, the ultraviolet radiation absorption film 56 formed from a material having high ultraviolet radiation absorptivity covers the top of the coating member 55. Thus the coating member 55 and the light-emitting element 30 covered by the coating member 55 hardly deteriorate due to ultraviolet radiation. Thus product life of the display device 1 can be prolonged.

Although embodiments of the present disclosure are described above, the present disclosure is not limited to the aforementioned embodiments. The display device 1 according to Embodiments 1 to 3, as illustrated in FIG. 1, is the display device 1 formed by assembly of 16 display units 10 in an array of 4 rows by 4 columns. However, this configuration is merely illustrative in order to aid in understanding of the present disclosure. In the present disclosure, the display device 1 may be any device that displays the image. Thus the configuration of the display device 1 may omit the display units 10. Further, when the display device 1 includes the display units 10, the number of units is not limited.

In the display device 1 according to Embodiments 1 to 3, the display unit 10 includes the light-emitting elements 30 arrayed as 7 rows by 7 columns as illustrated in FIG. 2. However, the present disclosure is not limited to this configuration. FIG. 2 is merely illustrative in order to aid in understanding of the present disclosure. In the present disclosure, the display device 1 may have any configuration as long as the light-emitting elements 30 are arrayed in a regular manner and separated from each other.

In Embodiment 1, the protective film 50 covers the upper surface 30A of the light-emitting elements 30. Further, in Embodiments 2 and 3, the coating member 55 covers the upper surface 30A of the light-emitting elements 30. However, the present disclosure is not limited to this configuration. The present disclosure may have any configuration by which each of the light-emitting elements 30 is covered by the film member that is waterproof, has transmissivity to visible light, and has weather resistance, and by which the film member closely adheres to the upper surface of the substrate 20 between the light-emitting elements 30 (that is, the surface on which the light-emitting elements 30 are mounted). In Embodiments 1 to 3, the protective film 50, the coating member 55, and the combination of the coating member 55 and the ultraviolet radiation absorption film 56 are the film members.

Figure 8:
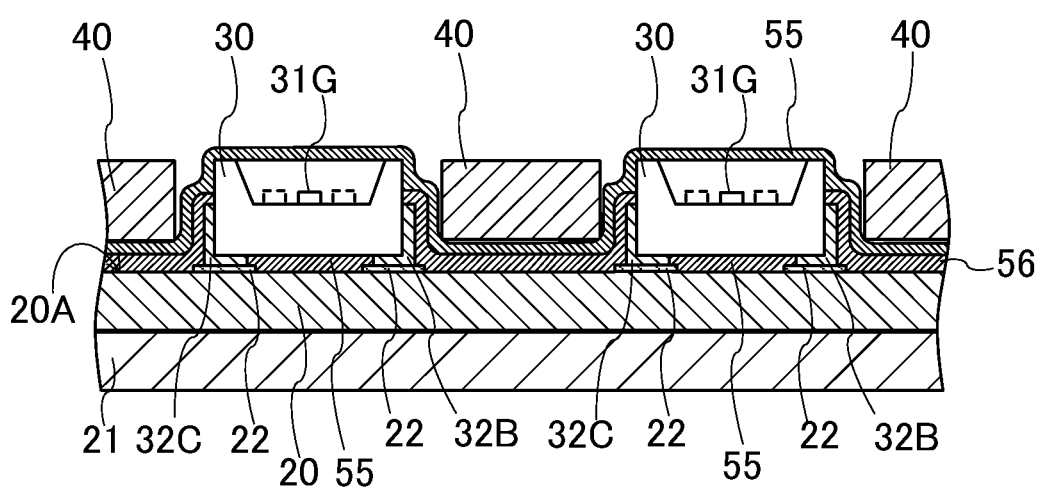
FIG. 8 is a cross-sectional view of a modified example of the protective film.

When the ultraviolet radiation absorption film 56 described in Embodiment 3 is waterproof, coating of the upper surface 30A of the light-emitting element 30 by the coating member 55 may be omitted in Embodiment 3. As illustrated in FIG. 8, coverage of the coating member 55 may be from the side surface of the package 35 of the light-emitting element 30 to the side surface of the package 35 of another light-emitting element 30 adjacent to the light-emitting element 30. In this case, the close adherence may be anywhere as long as there is close adherence to the upper surface of the substrate 20 between the light-emitting elements 30. This embodiment at least prevents contact between water and the package electrodes 32R to 32C, and enables prevention of deterioration of the package electrodes 32R to 32C by water. Further, if the ultraviolet radiation absorption film 56 is water resistant, deterioration of the package electrodes 32R to 32C due to water penetrating to the side surfaces from the front surface of the package 35 can be prevented.

In Embodiments 1 to 3, the protective film 50 or the coating member 55 closely adheres to the upper surface 30A and the side surfaces of the package 35 of the light-emitting elements 30. However, the present disclosure is not limited to such configuration. In the present disclosure as described above, the film member that is waterproof, has transmissivity to visible light, and has weather resistance covering each of the light-emitting elements 30, and closely adhering to the upper surface of the substrate 20 between the light-emitting elements 30, are sufficient. Thus the protective film 50 or the coating member 55 may simply cover the upper surface 30A without closely adhering to the upper surface 30A of the light-emitting elements 30. For example, in the case in which a lens is arranged in the upper surface 30A of the light-emitting element 30, in order to maintain optical performance, a gap may be provided between the upper surface 30A of the light-emitting element 30 and the protective film 50 or the coating member 55.

In Embodiments 1 to 3, the light-emitting elements 30 include light emitting diodes 31R to 31B that emit blue, red, and green light. However, the present disclosure is not limited to this configuration. In the present disclosure, the light-emitting element 30 may be any such element that emits visible light for the display of the image. For example, the light-emitting element 30 may include a light emitting diode that emits white light. Further, the light-emitting element 30 may include the light emitting diodes 31R to 31B that emit light of any one color from among blue, red, and green.

In Embodiments 1 to 3, the light emitting diodes 31R to 31B of the three colors blue, red, and green are contained in one light-emitting element 30. However, the present disclosure is not limited to this configuration. One light-emitting element 30 may contain the light emitting diodes 31R to 31B that emit light of any one color from among blue, red, and green. In this case, sets of three light-emitting elements 30 that emit blue, red, and green light respectively may be arrayed.

In Embodiments 1 to 3, the light-emitting element 30 is arrayed in a matrix pattern. However, the present disclosure is not limited to this configuration. In the present disclosure, the light-emitting elements 30 may be arranged in any manner on the substrate 20 as long as the light-emitting elements 30 are arrayed in a regular manner and separated from each other. In addition to being arrayed in the matrix pattern, the light-emitting elements 30 may be arrayed in a so-called "4" pattern, that is to say, in a triangular pattern.

In Embodiments 1 to 3, the display unit 10 is equipped with louvers 40 that extend laterally. However, the present disclosure is not limited to this configuration. Any configuration is permissible as long as the louver 40 is arranged abutting the surface of the film member (protective film 50, coating member 55, and the like) opposite to the substrate 20, and is arranged between the light-emitting elements 30, so that reflection of outside light is prevented. For example, the louver 40 may be formed in a lattice pattern, and the light-emitting elements 30 may be arranged in the opening parts of the lattice. Contrast of the display device 1 can be improved even when the louver 40 is configured in this manner.

In Embodiments 1 to 3, the light emitting diodes 31R to 31B are covered with epoxy resin. However, the present disclosure is not limited to this configuration. In the present disclosure, the light emitting diodes 31R to 31B may be covered with a resin for which weather resistivity is lower than for the film member (protective film 50, coating member 55, and the like). Due to the lack of requirement for the high weather resistivity, an inexpensive resin may be used as the resin that covers the light emitting diodes 31R to 31B.

In Embodiments 1 to 3, the package electrodes 32R to 32C are arranged at the side surfaces of the package 35 of the light-emitting element 30. However, the present disclosure is not limited to this configuration. The package electrodes 32R to 32C may be arranged anywhere as long as these electrodes contact the electrode pads 22 arranged on the substrate 20. Thus the package electrodes 32R to 32C may be termed a lead frame.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Display device
10 Display unit
10A Screen
20 Substrate
20A Front surface
21 Case
22 Electrode pad
30 Light-emitting element
30A Upper surface
30B Concavity
31R, 31G, 31B Light emitting diode
32R, 32G, 32B, 32C Package electrode
35 Package
40 Louver
40A Upper surface
50 Protective film
51 Base layer
52 Adhesive layer
55 Coating member
56 Ultraviolet radiation absorption film
D Depth
H1 to H3 Height
T Thickness

The invention claimed is:

1. A display device comprising:
a substrate;
light-emitting elements to emit visible light, arrayed in a regular manner and separated from each other on one surface of the substrate; and
a film member covering each of the light-emitting elements and closely adhering to the one surface of the substrate between the light-emitting elements, the film member being waterproof, having transmissivity to visible light, and having weather resistance, wherein
each of the light-emitting elements comprises a light emitting diode covered with a resin having a weather resistivity that is lower than a weather resistivity of the film member,
each of the light-emitting elements further comprises electrodes connected to electrode pads disposed on the substrate, and
the film member is in contact with the electrode pads.

2. The display device according to claim 1, wherein the resin includes an epoxy resin.

3. The display device according to claim 1, wherein
each of the electrodes has a height that is at least 20% and no more than 100% of a height of the light-emitting element, where the heights are in a direction of separation from the one surface of the substrate.

4. The display device according to claim 3, wherein the film member has a thickness that is less than the height of the electrode.

5. The display device according to claim 1, further comprising:
a louver disposed between the light-emitting elements and abutting a surface of the film member opposite to the substrate, wherein a surface of the louver opposite to the substrate is disposed more adjacent to the substrate than a surface of each of the light-emitting elements opposite to the substrate.

6. The display device according to claim 1, wherein the film member comprises an adhesive layer or a bonding layer on the one side of the substrate.

7. The display device according to claim 1, wherein the film member comprises a substance having ultraviolet radiation absorptivity.

8. The display device according to claim 1, wherein the film member comprises a water resistant layer and an ultraviolet radiation absorption layer stacked on the water resistant layer.

9. A method for manufacturing a display device, the method comprising:

arranging light-emitting elements to be arrayed in a regular manner and separated from each other on one surface of a substrate, mounting the light-emitting elements on the surface of the substrate, the light-emitting elements emitting visible light, and connecting electrodes of the light-emitting elements to electrode pads disposed on the substrate; and covering, with a film member, the one surface of the substrate on which the light-emitting elements are mounted, causing the film member to closely adhere to the one surface of the substrate between the light-emitting elements, the film member being waterproof, having transmissivity to visible light, and having weather resistance, and causing the film member to be in contact with the electrode pads, wherein the arranging and mounting of the light-emitting elements includes arranging and mounting the light-emitting elements that include light emitting diodes covered with a resin having a lower weather resistivity than the film member.

10. The method for manufacturing the display device according to claim 9, wherein the causing of the film member to closely adhere to the one surface of the substrate includes activation treatment of the surface of the film member to impart adhesivity to the surface of the film member, and attaching to the one surface of the substrate the surface imparted the adhesivity.

11. A method for manufacturing a display device, the method comprising:

arranging light-emitting elements to be arrayed in a regular manner and separated from each other on one surface of a substrate, mounting the light-emitting elements on the one surface of the substrate, the light-emitting elements emitting visible light, and connecting electrodes of the light-emitting elements to electrode pads disposed on the substrate; and applying a coating material to the one surface of the substrate on which the light-emitting elements are mounted, to coat with the coating material (i) each of the light-emitting elements, (ii) the one surface of the substrate between the light-emitting elements, and (iii) the electrode pads, the coating material being waterproof and having transmissivity to visible light, wherein the arranging and mounting of the light-emitting elements includes arranging and mounting the light-emitting elements that include light emitting diodes covered with a resin having a weather resistivity that is lower than a weather resistivity of the coating material.

12. A display device comprising:

a substrate;

light-emitting elements to emit visible light, arrayed in a regular manner and separated from each other on one surface of the substrate; and a film member covering each of the light-emitting elements and closely adhering to the one surface of the substrate between the light-emitting elements, the film member being waterproof, having transmissivity to visible light, and having weather resistance, wherein the film member comprises a water resistant layer and an ultraviolet radiation absorption layer stacked on the water resistant layer.

* * * * *